United States Patent [19]

Schaller

[11] Patent Number: 4,538,210
[45] Date of Patent: Aug. 27, 1985

[54] MOUNTING AND CONTACTING ASSEMBLY FOR PLATE-SHAPED ELECTRICAL DEVICE

[75] Inventor: Werner Schaller, Lampertheim, Fed. Rep. of Germany

[73] Assignee: Siemens Aktiengesellschaft, Munich, Fed. Rep. of Germany

[21] Appl. No.: 479,996

[22] Filed: Mar. 29, 1983

[30] Foreign Application Priority Data

Apr. 15, 1982 [DE] Fed. Rep. of Germany ....... 3213884

[51] Int. Cl.³ ............................................. H05K 1/16
[52] U.S. Cl. ...................................... 361/401; 357/69; 357/70; 361/406; 361/408
[58] Field of Search ....................... 361/401, 406, 408; 357/69, 70

[56] References Cited

U.S. PATENT DOCUMENTS

| | | | |
|---|---|---|---|
| 3,011,379 | 12/1961 | Corwin | 361/401 X |
| 3,316,458 | 4/1967 | Jenny | 361/401 |
| 3,484,534 | 12/1969 | Kilby et al. | 361/401 X |
| 3,544,950 | 12/1970 | Lopez et al. | 361/401 X |
| 3,739,232 | 6/1973 | Grossman et al. | 361/401 |
| 3,924,918 | 12/1975 | Friend | 361/408 X |
| 4,109,296 | 8/1978 | Rostek et al. | 361/401 |
| 4,214,120 | 7/1980 | Jones et al. | 357/70 X |
| 4,411,719 | 10/1983 | Lindberg | 174/68.5 X |

FOREIGN PATENT DOCUMENTS 55-24479  2/1980  Japan ..................... 357/69

OTHER PUBLICATIONS

W. E. Dougherty, Connection of Discrete Leads to Packaged Circuits, IBM Tech. Disc. Bull., V. 14 #8, Jan. 1972, p. 2435.

Primary Examiner—R. R. Kucia
Attorney, Agent, or Firm—Kenyon & Kenyon

[57] ABSTRACT

A circuit board having a window for receiving an electronic device substantially in the form of a plate is provided with elastic holding tabs of at least two different lengths which project into the window, the tabs forming the ends of conductor runs on the circuit board. Upon a pushing of the plate through the window, the short holding tabs snap back and the plate becomes clamped to the circuit board by the holding tabs, these tabs also serving to complete the electrical coupling between the conductor runs of the circuit board and contacts on the plate.

24 Claims, 5 Drawing Figures

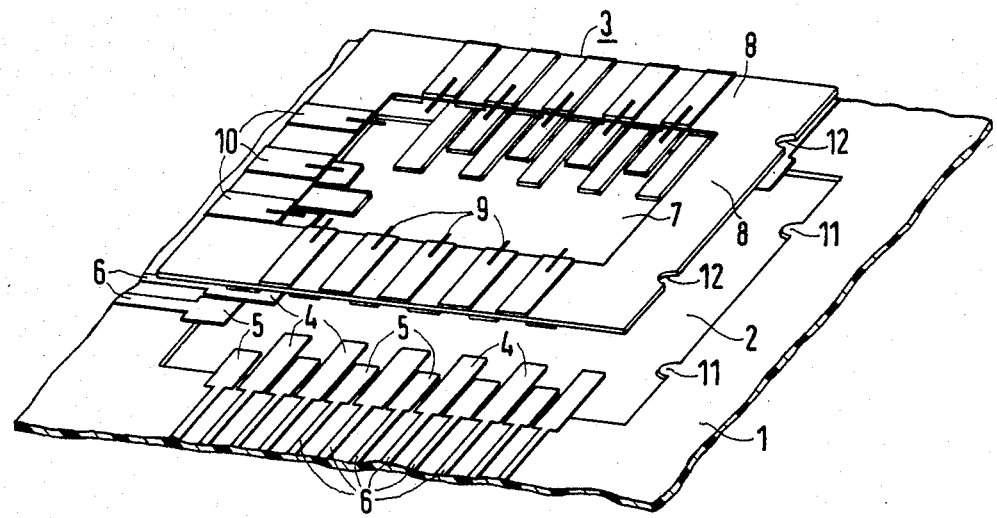
FIG 1
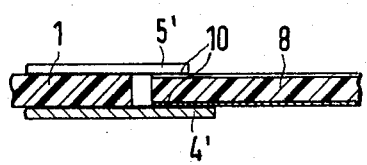
FIG 2
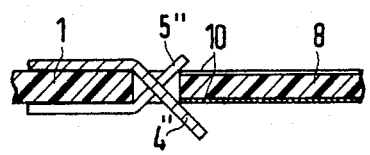
FIG 3
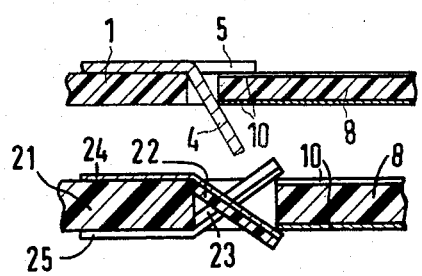
FIG 4
FIG 5

MOUNTING AND CONTACTING ASSEMBLY FOR PLATE-SHAPED ELECTRICAL DEVICE

BACKGROUND OF THE INVENTION

This invention relates in general to a mount for holding a plate-shaped electrical device having a periphery with a multiplicity of electrical contacts. More particularly, this invention relates to a contact assembly, on a mount in the form of a circuit board, for connecting the contacts of the plate-shaped device to respective conductor runs on the circuit board.

In conventional contact assemblies or arrangements of the above-mentioned type, for instance, IC or integrated circuit chips in dual-in-line housings, the IC contacts provided in the peripheral area of the housings are angled off and are either plugged into sockets on the circuit board which are connected to conductor runs, or connected directly thereto by drilling holes in the conductor runs and soldering the angled-off contacts thereto at the holes. While this is a relatively reliable connecting method, it is very expensive since the conductor runs must be provided with corresponding holes and the contacts must be threaded into these holes before the soldering can take place. Moreover, the so-called dual-in-line housings already contain film sections in which IC-chips are held and electrically contacted; in such housings the electrical contact points on the film section must be brought to the outside and connected to the contacts in the peripheral areas of the housing. In addition to the expensive fastening, this arrangement requires a relatively large amount of space on the circuit board.

During assembly, the film sections are brought by hand into the necessary position coinciding with the contacts and are held there, while the now oppositely arranged peripheral contacts of the film section, provided with solder, are soldered to the mating contacts on the conductor runs, likewise provided with solder. In this manual operation, extreme care must be taken to ensure that accurate positioning is obtained. In addition, the soldering operation, which is difficult because of the smallness of the film sections, places stringent requirements on the person doing the soldering. The entire process requires considerable time because of the necessary precision. Since the success of the manual mounting operation depends on the qualifications and disposition of the person doing the positioning and soldering, errors in soldering or even partial destruction of the IC chip-bearing film sections, which must be soldered sequentially in a production run, are to be expected. A disproportionately large rejection rate frequently occurs.

It is furthermore possible to use window masks for positioning the film sections carrying the IC chips, the windows being designed and arranged so that the film sections occupy the specified positions upon a manual insertion into the windows. The disadvantages of manual mounting, including the large amounts of time required and the high rejection risk, still remain, however. In addition, a mask makes the holding and the soldering of a film section more difficult.

It is therefore an object of the invention to provide an improved contact arrangement of the above-mentioned type, which can be used particularly with relatively small electronic circuit boards and by which the connection of contacts and conductor runs can be made faster, more simply and more reliably.

SUMMARY OF THE INVENTION

In accordance with this invention, a circuit board mount is provided with a window which is essentially adapted to the size of the plate-shaped device, the edges of the window being provided with elastically resilient holding tabs of at least two different lengths. The tabs project into the window and form at least in part conductor run ends which correspond to the contacts in the peripheral area of the plate-shaped device. To mount the device to the circuit board it is merely necessary to push the device through the window, increasingly bending the holding tabs until the edge of the plate passes the ends of the shorter holding tabs, whereupon the latter spring back into their original positions. After release of the device, the latter is clamped between the long and the short holding tabs. If the contact arrangement is to be subjected to a high level of stress it may be advantageous to subsequently solder the contacts to the conductor runs. In order to achieve uniform clamping of the edges of the device, it is preferable to arrange the holding tabs of different lengths in pairs. In order to prevent an undesirable shifting or rotation of the plate with respect to the circuit board it is advantageous to provide matingly engageable projections and recesses on the circuit board and the device. It has been found of further advantage to provide insertion aids at the circuit board for facilitating the mounting of the device. This can be accomplished by two diagonally opposite corners. This ensures an even more accurate positioning of the holding tabs on the conductor runs, which is of advantage especially if the number or the size of the holding tabs is different or their geometric arrangement is asymmetrical.

In accordance with a particular feature of this invention, the holding tabs are part of the cladding of the circuit board. If the circuit board is clad on both sides and if the plate-shaped device has a thickness equal to that of the circuit board, the contacts at the periphery of the plate can engage the inside surfaces of the cladding. If the plate-shaped device is thinner than the circuit board, higher contact pressure are obtainable if the holding tabs on the underside of the circuit board engage the top side or edge of the device and the holding tabs on the top side of the circuit board engage the underside or lower edge of the device. Since the cladding is in general relatively thin, it is advantageous if the circuit board is a flexible circuit board and the insulating carrier material of the circuit board is part of the holding tabs.

The contact arrangement according to the invention is suitable particularly for smaller electrical or electronic devices, such as film sections equipped with IC chips (micropack).

BRIEF DESCRIPTION OF THE DRAWING

FIG. 1 is an exploded perspective view of a plate-shaped electronic device and a circuit board with a window, showing contact-forming holding tabs in accordance with the present invention.

FIG. 2 is a partial cross-sectional view of a plate-shaped electronic device and a circuit board in an assembled state, showing holding tabs in accordance with this invention as part of the cladding of the circuit board.

FIG. 3 is a partial sectional view similar to FIG. 2, showing crisscrossed holding tabs.

FIG. 4 is a partial cross-sectional view similar to FIGS. 2 and 3, showing the circuit board of FIG. 1, with cladding and holding tabs only on one side of the circuit board.

FIG. 5 is a partial cross-sectional view, similar to FIGS. 2-4, showing a circuit board with holding tabs formed largely from the carrier material of the board.

DETAILED DESCRIPTION

As illustrated in FIG. 1, a mount in the form of a circuit board 1 is provided with a window 2 having a size and shape adapted to an electrical device 3 in the form of a plate-shaped micropack. Circuit board 1 is equipped with elastically resilient holding tabs 4 and 5 which extend into window 2 and form the ends of respective conductor runs 6. Conductor runs 6 together with holding tabs 4 and 5 may be part of the cladding which is applied to circuit board 1 at least partially via etching techniques.

The electrical or electronic device 3 to be mounted on circuit board 1 comprises an IC chip (not shown) which occupies a space 7 in the center of a planar film section 8, the chip being conductively or operatively tied via spider-like connections 9 to a multiplicity of contacts 10 distributed about the periphery of film section 8 in a predetermined array. Contacts 10 may be provided on both sides of film section 8, as shown in FIG. 1, whereby holding tabs 4 as well as holding tabs 5 are utilizable for making electrical contact, as described more fully hereinafter.

Holding tabs 4 have a common length larger than the common length of holding tabs 5, whereby tabs 4 project a greater distance than tabs 5 into window 2. During an assembly operation, film section 8 is pushed through window 2, holding tabs 4 and 5 being bent to an increasing great degree until the outer edge of the film section passes the ends of the shorter holding tabs 5, whereupon the latter spring back into their original positions substantially in the plane of circuit board 1. Upon a subsequent release of film section 8, holding tabs 4 shift the film section into a middle position, as illustrated in FIG. 4.

As illustrated in FIG. 1, circuit board 1 may be provided with cladding on one side only, in which case it is possibly advantageous to use only one set of holding tabs 4 or 5 for implementing the electrical connection with contacts 10. Whether holding tabs 4 as well as tabs 5 are to be used in operatively linking contacts 10 to conductor runs 6 depends in part on the number of contacts 10 but also depends on whether contacts 10 are disposed on both sides of film section 8. Generally, micropacks have contacts 10 only on one side of film section 8, so that it is not necessary to use both the long and the short tabs 4 and 5. In the case of a micropack with contacts on both sides, long holding tabs 5 are bent, in an assembled state of film section 8 and circuit board 1, to engage the electrical contacts on the opposite side of the film section, as illustrated in FIG. 4.

The assembled or snapped-in state of film section 8 and circuit board 1 is illustrated in FIG. 2 for a case in which the circuit board has cladding on both sides. According to the figure, holding tabs 4' and 5' lie below and above circuit board 1, respectively, and resume their original positions upon the mounting of a film section 8 having the same thickness as the circuit board.

It is also possible, as illustrated in FIG. 3, to provide on opposite sides of circuit board 1 holding tabs 4" and 5" which are criss-crossed with respect to one another upon the completion of the mounting or insertion operation. In this case, the holding tabs 5" on one side of circuit board 1 are angled towards the other side thereof to engage contacts 10 located diagonally opposite holding tabs 5". In a similar fashion, holding tabs 4" are bent to engage contacts 10 located diagonally opposite the tabs. The contact arrangement of FIG. 3 is particularly advantageous when film section 8 is thinner than circuit board 1.

The holding tabs may comprise in part the base or carrier material of the circuit board if a flexible circuit board is used. As shown in FIG. 5, a circuit board 21 is provided in the area of window 2 (see FIG. 1) with a multiplicity of tongues 22 and 23 projecting from respective sides of circuit board 21 into the window. Each side of circuit board 21 is provided with a thin cladding 24 and 25 which extends in part over tongues 22 and 23. Tongues 22 and 23, together with their respective cladding layers, form holding or clamping tabs for mechanically holding film section 8 of a micropack and for conductively engaging contacts 10 at the periphery of the film section.

It is to be noted that, in accordance with this invention, window 2 (see FIG. 1) is of approximately the same linear dimensions as film section or plate 8, the similarity in size and shape providing some protection against possible shifting, and in particular rotation, of the film section relative to circuit board 1 (or 21). Further protection is secured by the provision of interlocking projections 11 and cutouts or recesses 12 on circuit board 1 (or 21) at the window 2 and on film section 8 at the outer edge thereof, respectively.

If the contact assembly, including holding tabs 4 and 5 (or 4' and 5' or 4" and 5"), is to be subjected to a high level of mechanical stress, it is advantageous to solder contacts 10 to tabs 4 and 5 upon mounting film section 8.

What is claimed is:

1. In a mount in the form of a circuit board for holding an electrical device comprising a plate member with a periphery bearing a multiplicity of electrical contacts in a predetermined array, said circuit board having a window larger than said plate member for receiving same, said circuit board being provided with conductor runs and connection means for operatively linking said conductor runs to respective electrical contacts of said plate member, the improvement comprising:

a multiplicity of elastically resilient holding tabs attached to the circuit board, at least some of said holding tabs being operatively connected to respective conductor runs of said circuit board, said holding tabs including respective tab portions projecting into said window in a disposition corresponding at least in part to the array of electrical contacts on the periphery of the plate member, the connection means including at least some of said holding tabs, said window having approximately the same size and shape as said plate member, said plate member having a first side and a second side facing opposite thereto, said tab portions including short tab portions having a first length and long tab portions having a second length greater than said first length, said lengths differing by a sufficiently great amount and said holding tabs being sufficiently resilient so that, upon an engagement of said tab portions with said first side of said plate member and a motion thereof through said window, all of said tab portions initially bend in the direction of motion of said plate member and said short tab portions subsequently snap back in a direction opposite said motion of said plate member, said short tab portions engaging said second side and said long tab portions engaging said first side of said plate member upon a mounting thereof in said window.

2. The improvement defined in claim 1 wherein said holding tabs are disposed in pairs on said circuit board, the tabs of each such pair having tab portions projecting different distances into said window.

3. The improvement defined in claim 2 wherein said circuit board and said plate member are provided with locking means for preventing the rotation of said plate member relative to said circuit board upon a mounting of said plate member in said window.

4. The improvement defined in claim 3 wherein said locking means includes projections and recesses matingly engageable therewith.

5. The improvement defined in claim 4 wherein said circuit board is provided with cladding and at least some of said holding tabs are part thereof.

6. The improvement defined in claim 5 wherein said circuit board has cladding on both sides and a plurality of said holding tabs are part of the cladding on one side of said circuit board and another plurality of said holding tabs are part of the cladding on the other side of said circuit board.

7. The improvement defined in claim 6 wherein said circuit board is flexible and comprises an insulating carrier material forming a part of at least a plurality of said holding tabs.

8. The improvement defined in claim 7 wherein, upon a mounting of said plate in said window, the holding tabs attached to one side of said circuit board are crisscrossed with the holding tabs attached to the other side of said circuit board.

9. The improvement defined in claim 8 wherein, upon a mounting of said plate in said window, at least some of said holding tabs are soldered to respective electrical contacts of said plate.

10. The improvement defined in claim 9 wherein said electrical device is a film section provided with integrated circuit chips.

11. The improvement defined in claim 1 wherein said circuit board and said plate member are provided with locking means, including projections and recesses matingly engageable therewith, for preventing rotation of said plate member relative to said circuit board upon a mounting of said plate member in said window.

12. The improvement defined in claim 1 wherein said circuit board is provided with cladding and at least some of said holding tabs are part thereof.

13. The improvement defined in claim 12 wherein said circuit board has cladding on both sides and a plurality of said holding tabs are part of the cladding on one side of said circuit board and another plurality of said holding tabs are part of the cladding on the other side of said circuit board.

14. The improvement defined in claim 13 wherein, upon a mounting of said plate in said window, the holding tabs attached to one side of said circuit board are crisscrossed with the holding tabs attached to the other side of said circuit board.

15. The improvement defined in claim 1 wherein said circuit board is flexible and comprises an insulating carrier material forming a part of at least a plurality of said holding tabs.

16. The improvement defined in claim 1 wherein, upon a mounting of said plate in said window, at least some of said holding tabs are soldered to respective electrical contacts of said plate.

17. The improvement defined in claim 1 wherein said electrical device is film section provided with integrated circuit chips.

18. In a mount in the form of a circuit board for holding an electrical device comprising a plate member with a periphery bearing a multiplicity of electrical contacts in a predetermined array, said circuit board having a window larger than said plate member for receiving same, said circuit board being provided with conductor runs and connection means for operatively linking said conductor runs to respective electrical contacts of said plate member, the improvement comprising:

a multiplicity of elastically resilient holding tabs attached to the circuit board, at least some of said holding tabs being operatively connected to respective conductor runs of said circuit board, said holding tabs including respective tab portions projecting into said window in a diposition corresponding at least in part to the array of electrical contacts on the periphery of the plate member, said tab portions having at least two different lengths, whereby mounting of said plate member in the window of said circuit board is facilitated, the connection means including at least some of said holding tabs, said window having approximately the same size and shape as said plate member, said circuit board having cladding on both sides, a plurality of said holding tabs being part of the cladding on one side of said circuit board and another plurality of said holding tabs being part of the cladding on the other side of said circuit board, the holding tabs attached to one side of said circuit board being crisscrossed with the holding tabs attached to the other side of said circuit board upon a mounting of said plate member in said window.

19. The improvement defined in claim 18 wherein said holding tabs are disposed in pairs on said circuit board, the tabs of each such pair having tab portions projecting different distances into said window.

20. The improvement defined in claim 19 wherein said circuit board and said plate member are provided with locking means for preventing the rotation of said plate member relative to said circuit board upon a mounting of said plate member in said window.

21. The improvement defined in claim 20 wherein said locking means includes projections and recesses matingly engageable therewith.

22. The improvement defined in claim 19 wherein said circuit board is flexible and comprises an insulating carrier material forming a part of at least a plurality of said holding tabs.

23. The improvement defined in claim 19 wherein, upon a mounting of said plate in said window, at least some of said holding tabs are soldered to respective electrical contacts of said plate.

24. The improvement defined in claim 23 wherein said electrical device is a film section provided with integrated circuit chips.

* * * * *